US010867771B2

(12) United States Patent
Kawai

(10) Patent No.: US 10,867,771 B2
(45) Date of Patent: Dec. 15, 2020

(54) ELECTRON MICROSCOPE AND SPECIMEN TILT ANGLE ADJUSTMENT METHOD

(71) Applicant: JEOL Ltd., Tokyo (JP)

(72) Inventor: Shuji Kawai, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/161,393

(22) Filed: Oct. 16, 2018

(65) Prior Publication Data
US 2019/0115187 A1 Apr. 18, 2019

(30) Foreign Application Priority Data

Oct. 17, 2017 (JP) .................................. 2017-200803

(51) Int. Cl.
*H01J 37/26* (2006.01)
*H01J 37/295* (2006.01)
(Continued)

(52) U.S. Cl.
CPC ............ *H01J 37/261* (2013.01); *H01J 37/10* (2013.01); *H01J 37/1471* (2013.01);
(Continued)

(58) Field of Classification Search
CPC ........ H01J 37/26; H01J 37/261; H01J 37/265; H01J 37/295
See application file for complete search history.

(56) References Cited

U.S. PATENT DOCUMENTS 6,570,156 B1 * 5/2003 Tsuneta .................. H01J 37/26
250/311
2017/0133195 A1 * 5/2017 Yaguchi .................. H01J 37/22

FOREIGN PATENT DOCUMENTS

JP 11288679 A 10/1999
JP 2010212067 A 9/2010

OTHER PUBLICATIONS

Weisstein, Eric W. "Rotation Matrix." From MathWorld—A Wolfram Web Resource. http://mathworld.wolfram.com/RotationMatrix.html, as captured by waybackmachine on Jul. 12, 2008.*

* cited by examiner

*Primary Examiner* — Eliza W Osenbaugh-Stewart
(74) *Attorney, Agent, or Firm* — The Webb Law Firm

(57) ABSTRACT

An electron microscope includes: an irradiation lens system that irradiates a specimen with an electron beam; an irradiation system deflector that deflects an electron beam incident on the specimen; a specimen tilting mechanism that tilts the specimen; an imaging lens system that forms an electron diffraction pattern or an electron microscope image by using an electron having passed through the specimen; an imaging device that acquires the electron diffraction pattern or the electron microscope image formed by the imaging lens system; and a controller that controls the irradiation system deflector and the specimen tilting mechanism. The controller performs: a process of acquiring a plurality of electron diffraction patters formed by using electron beams having different incidence angles to the specimen, the different incidence angles having been obtained by deflecting the electron beams incident on the specimen by using the irradiation system deflector; a process of calculating a tilt angle of the specimen based on the plurality of electron diffraction patterns; and a process of controlling the specimen tilting mechanism so that the specimen has the calculated tilt angle.

6 Claims, 12 Drawing Sheets

(51) Int. Cl.
*H01J 37/10* (2006.01)
*H01J 37/147* (2006.01)
*H01J 37/153* (2006.01)

(52) U.S. Cl.
CPC .......... *H01J 37/153* (2013.01); *H01J 37/265* (2013.01); *H01J 37/295* (2013.01); *H01J 2237/20207* (2013.01); *H01J 2237/221* (2013.01); *H01J 2237/24578* (2013.01); *H01J 2237/2802* (2013.01); *H01J 2237/2805* (2013.01); *H01J 2237/2817* (2013.01); *H01J 2237/2826* (2013.01)

ELECTRON MICROSCOPE AND SPECIMEN TILT ANGLE ADJUSTMENT METHOD

Japanese Patent Application No. 2017-200803, filed on Oct. 17, 2017, is hereby incorporated by reference in its entirety.

BACKGROUND OF THE INVENTION

Field of the Invention

The present invention relates to an electron microscope and a specimen tilt angle adjustment method.

Description of Related Art

An electron microscope can irradiate a specimen with an electron beam and magnify and image an electron having passed through the specimen with the aid of an imaging electron optical system. In this way, it is possible to observe the specimen with high resolution. Moreover, the electron microscope can examine arrangements of molecules and atoms of a material of a crystalline specimen on the basis of electron diffraction patterns. Furthermore, the electron microscope can scan an electron beam converged narrowly onto a specimen, detect an electron having passed through the specimen from a specific capturing angle, and synchronize a scanning signal with an electron detection signal. In this way, it is possible to acquire a scanning transmission electron microscope image. Furthermore, the electron microscope can be used in many applications, for example, analysis of atoms by detecting X-rays emitted from a specimen.

However, when electron diffraction patterns and the like are observed using a transmission electron microscope, it is necessary to adjust the direction of an incident electron beam with respect to the crystal orientation of a specimen. In recent years, before fine dimensions of a semiconductor specimen or the like are measured, an incidence direction of an electron beam is sometimes aligned on the basis of a silicon crystal. This is because a very small difference between a tilt angle of a specimen and an incidence direction of an electron beam may cause a measurement error.

Adjustment of an incidence direction of an electron beam with respect to the specimen (crystal orientation) is realized by tilting the specimen using a tilting mechanism capable of tilting the specimen independently in two-axis directions orthogonal to each other. The adjustment of a specimen tilt angle for aligning the crystal orientation of the specimen is generally performed by an operator watching change in an electron diffraction pattern while changing the tilt angle of the specimen.

As a technology for adjusting the specimen tilt angle automatically, for example, JP-A-11-288679 discloses a method of calculating a present crystal orientation of a specimen from an electron diffraction pattern acquired at an arbitrary specimen tilt angle and calculating a specimen tilt angle necessary for achieving a crystal orientation intended for observation.

As another example, JP-A-2010-212067 discloses a method of acquiring an electron diffraction pattern at each specimen tilt angle and calculating a specimen tilt angle from change in the electron diffraction pattern so that an electron beam incidence axis coincides with a crystal zone axis of a specimen.

Presently, in most cases, the adjustment of a specimen tilt angle for aligning a crystal orientation of a specimen is performed by an operator's manual operation. This adjustment can be realized in several seconds by skilled operators, whereas the adjustment may require a considerable time for inexperienced operators. In an electron diffraction mode of an electron microscope, since a very strong electron beam is incident on a fluorescent screen or an imaging device, it is preferable to achieve the adjustment in a short time to prevent burning of the fluorescent screen or damage to the imaging device.

In the method disclosed in JP-A-11-288679, it is necessary to register data required for computation such as lattice constants of various materials in advance in a computer. Therefore, it is not possible to adjust the specimen tilt angle automatically if a material is not registered in the computer, and thus, the method has a low versatility problem. Moreover, an operator has to register information on a material type and a crystal orientation into the computer whenever adjustment is performed, and thus, the method has a low operability problem.

In the method disclosed in JP-A-2010-212067, a specimen is mechanically tilted when acquiring the electron diffraction pattern at each specimen tilt angle. Due to this, it requires a considerable time to tilt the specimen, and thus, the adjustment of the specimen tilt angle takes time.

SUMMARY OF THE INVENTION

The invention provides an electron microscope and a specimen tilt angle adjustment method capable of adjusting a specimen tilt angle easily.

According to a first aspect of the invention, there is provided an electron microscope including:

an irradiation lens system that irradiates a specimen with an electron beam;

an irradiation system deflector that deflects an electron beam incident on the specimen;

a specimen tilting mechanism that tilts the specimen;

an imaging lens system that forms an electron diffraction pattern or an electron microscope image by using an electron having passed through the specimen;

an imaging device that acquires the electron diffraction pattern or the electron microscope image formed by the imaging lens system; and a controller that controls the irradiation system deflector and the specimen tilting mechanism, the controller performing:

a process of acquiring a plurality of electron diffraction patterns formed by using electron beams having different incidence angles to the specimen, the different incidence angles having been obtained by deflecting the electron beams incident on the specimen by using the irradiation system deflector;

a process of calculating a tilt angle of the specimen based on the plurality of electron diffraction patterns; and a process of controlling the specimen tilting mechanism so that the specimen has the calculated tilt angle.

According to a second aspect of the invention, there is provided a specimen tilt angle adjustment method in an electron microscope including an irradiation lens system that irradiates a specimen with an electron beam, an irradiation system deflector that deflects an electron beam incident on the specimen, a specimen tilting mechanism that tilts the specimen, an imaging lens system that forms an electron diffraction pattern or an electron microscope image by using an electron having passed through the specimen, and an imaging device that acquires the electron diffraction pattern or the electron microscope image formed by the imaging lens system, the method including:

acquiring a plurality of electron diffraction patters formed by using electron beams having different incidence angles to the specimen, the different incidence angles having been obtained by deflecting the electron beams incident on the specimen by using the irradiation system deflector;

calculating a tilt angle of the specimen based on the plurality of electron diffraction patterns; and tilting the specimen to have the calculated tilt angle.

DESCRIPTION OF THE INVENTION

Figure 1:
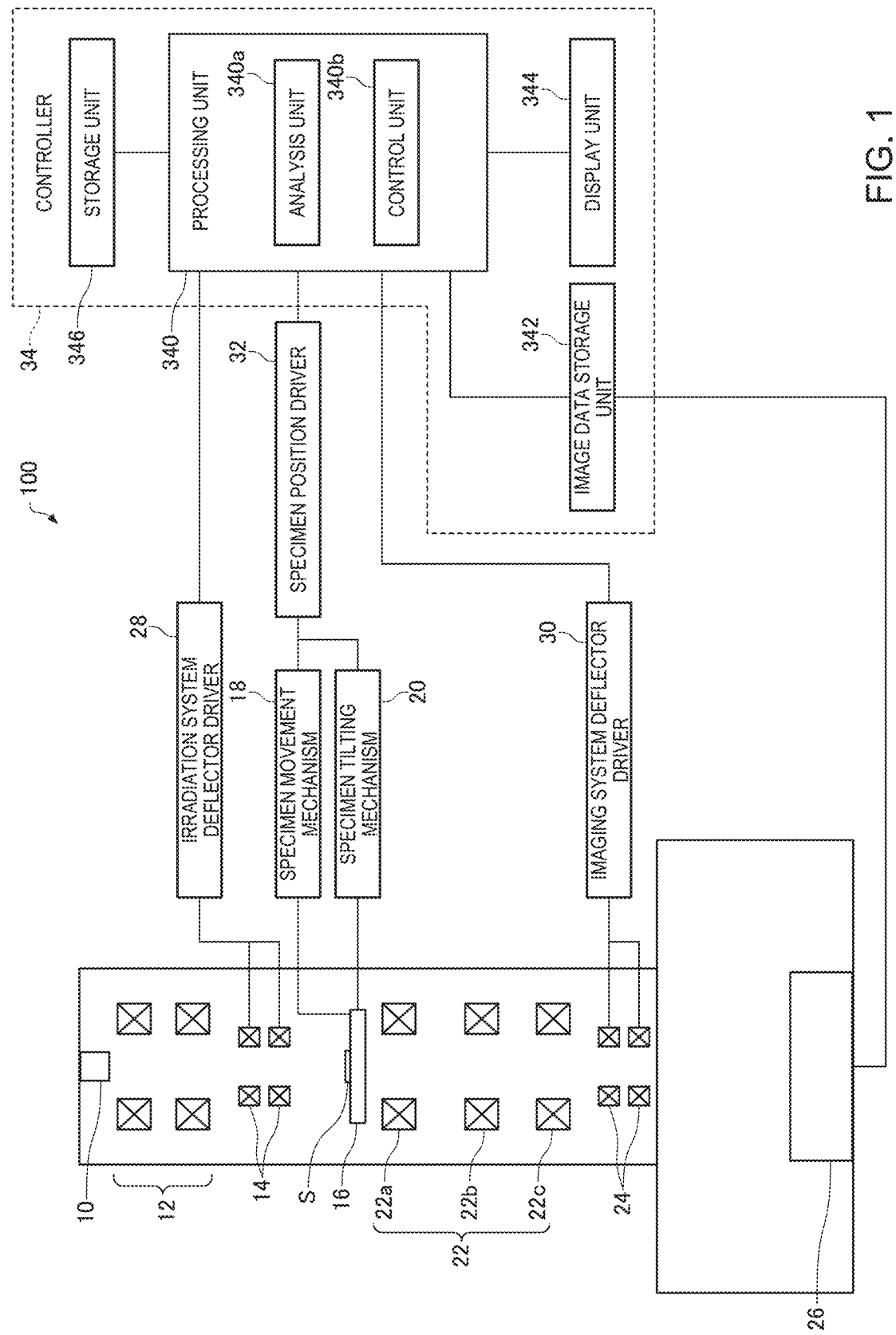
FIG. 1 is a diagram illustrating a configuration of an electron microscope according to an embodiment of the invention.

According to an embodiment of the invention, there is provided an electron microscope including:

an irradiation lens system that irradiates a specimen with an electron beam;

an irradiation system deflector that deflects an electron beam incident on the specimen;

a specimen tilting mechanism that tilts the specimen;

an imaging lens system that forms an electron diffraction pattern or an electron microscope image by using an electron having passed through the specimen;

an imaging device that acquires the electron diffraction pattern or the electron microscope image formed by the imaging lens system; and a controller that controls the irradiation system deflector and the specimen tilting mechanism, the controller performing:

a process of acquiring a plurality of electron diffraction patterns formed by using electron beams having different incidence angles to the specimen, the different incidence angles having been obtained by deflecting the electron beams incident on the specimen by using the irradiation system deflector;

a process of calculating a tilt angle of the specimen based on the plurality of electron diffraction patterns; and a process of controlling the specimen tilting mechanism so that the specimen has the calculated tilt angle.

With such an electron microscope, it is possible to adjust a specimen tilt angle automatically. Since a plurality of electron diffraction patterns obtained with electron beams having different incidence angles to a specimen by the irradiation system deflector deflecting an electron beam incident on a specimen, it is possible to adjust the specimen tilt angle in a short time. Therefore, with such an electron microscope, it is possible to adjust the specimen tilt angle easily.

According to an embodiment of the invention, there is provided a specimen tilt angle adjustment method in an electron microscope including an irradiation lens system that irradiates a specimen with an electron beam, an irradiation system deflector that deflects an electron beam incident on the specimen, a specimen tilting mechanism that tilts the specimen, an imaging lens system that forms an electron diffraction pattern or an electron microscope image by using an electron having passed through the specimen, and an imaging device that acquires the electron diffraction pattern or the electron microscope image formed by the imaging lens system, the method including:

acquiring a plurality of electron diffraction patters formed by using electron beams having different incidence angles to the specimen, the different incidence angles having been obtained by deflecting the electron beams incident on the specimen by using the irradiation system deflector;

calculating a tilt angle of the specimen based on the plurality of electron diffraction patterns; and tilting the specimen to have the calculated tilt angle.

In such a specimen tilt angle adjustment method, since a plurality of electron diffraction patterns obtained with electron beams having different incidence angles to a specimen by the irradiation system deflector deflecting an electron beam incident on a specimen, it is possible to adjust the specimen tilt angle in a short time. Therefore, with such a specimen tilt angle adjustment method, it is possible to adjust the specimen tilt angle easily.

Hereinafter, embodiments of the invention will be described in detail with reference to the drawings. The following embodiments do not unduly limit the scope of the invention as stated in the claims. All of the elements described in connection with the following embodiments should not necessarily be taken as essential requirements of the invention.

1. Electron Microscope

First, an electron microscope according to an embodiment of the invention will be described with reference to the drawings. FIG. 1 is a diagram illustrating a configuration of an electron microscope 100 according to the present embodiment.

As illustrated in FIG. 1, the electron microscope 100 includes an electron source 10, an irradiation lens system 12, an irradiation system deflector 14, a specimen stage 16, a specimen movement mechanism 18, a specimen tilting mechanism 20, an imaging lens system 22, an imaging system deflector 24, an imaging device 26, an irradiation system deflector driver 28, an imaging system deflector driver 30, a specimen position driver 32, and a controller 34.

The electron source 10 generates an electron beam. The electron source 10 is an electron gun, for example, in which an electron emitted from a cathode is accelerated in an anode to emit an electron beam.

The irradiation lens system 12 irradiates a specimen S with the electron beam emitted from the electron source 10. The irradiation lens system 12 includes a plurality of electron lenses, for example.

The irradiation system deflector 14 deflects the electron beam incident on the specimen S. The irradiation system deflector 14 can deflect the electron beam two-dimensionally. Moreover, the irradiation system deflector 14 can scan an electron beam.

Figure 2:
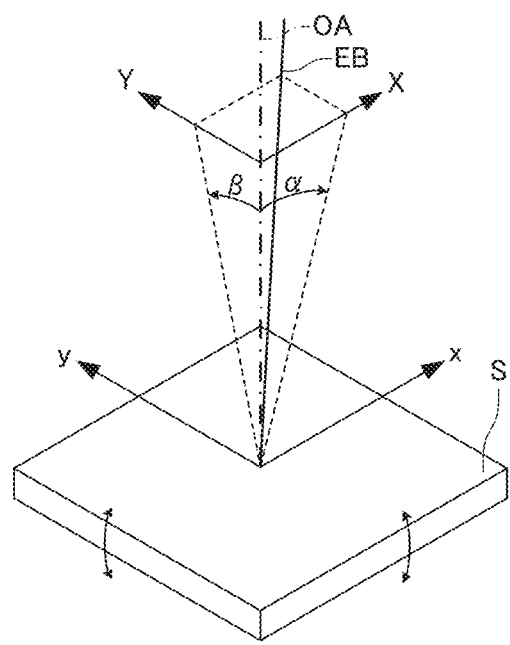
FIG. 2 is a diagram schematically illustrating a state in which an electron beam is deflected by an irradiation system deflector.

FIG. 2 is a diagram schematically illustrating a state in which an electron beam is deflected by the irradiation system deflector 14.

As illustrated in FIG. 2, an electron beam EB can be deflected two-dimensionally by the irradiation system deflector 14. That is, the electron beam EB can be tilted in two-axis directions (an X-axis direction and a Y-axis direction) orthogonal to each other by the irradiation system deflector 14. In this way, the electron beam EB can be incident on the specimen S from various directions. An incidence direction of the electron beam EB with respect to the specimen S is represented by an incidence angle (a tilt angle) α in the X-axis direction and an incidence angle (a tilt angle) β in the Y-axis direction.

The specimen stage 16 supports the specimen S. Although not illustrated in the drawings, the specimen stage 16 may support the specimen S with the aid of a specimen holder.

The specimen movement mechanism 18 moves the specimen S in a horizontal direction (for example, the x-axis direction and the y-axis direction orthogonal to each other illustrated in FIG. 2). The specimen movement mechanism 18 also moves the specimen S in an up-down direction. The specimen movement mechanism 18 moves the specimen S supported by the specimen stage 16 by moving the specimen stage 16.

The specimen tilting mechanism 20 tilts the specimen S. The specimen tilting mechanism 20 has two tilting axes and tilts the specimen S in the x-axis direction and the y-axis direction. The specimen tilting mechanism 20 tilts the specimen S supported by the specimen stage 16 by tilting the specimen stage 16. The specimen tilting mechanism 20 may be incorporated into the specimen stage 16 or may be incorporated into the specimen holder. The specimen tilting mechanism 20 may be configured, for example, such that a mechanism that tilts the specimen S in the x-axis direction is incorporated into the specimen stage 16 and a mechanism that tilts the specimen S in the y-axis direction is incorporated into the specimen holder.

The x-axis direction in which the specimen tilting mechanism 20 tilts the specimen S in the x-axis direction and the X-axis direction in which the irradiation system deflector 14 tilts an electron beam may be an identical direction or may be different directions. The same is applied to the relation between the y-axis direction in which the specimen tilting mechanism 20 tilts the specimen S and the Y-axis direction in which the irradiation system deflector 14 tilts an electron beam.

The imaging lens system 22 forms an electron diffraction pattern or an electron microscope image (a TEM image) by using electrons (transmission electrons) having passed through the specimen S. The imaging lens system 22 includes an objective lens 22a, an intermediate lens 22b, and a projection lens 22c.

The imaging system deflector 24 deflects an electron (a transmission electron) having passed through the specimen S two-dimensionally. Although the imaging system deflector 24 is disposed at a rear stage of the projection lens 22c in the illustrated example, the position thereof is not particularly limited as long as the imaging system deflector 24 is disposed at a rear stage of the objective lens 22a.

The imaging device 26 acquires (photographs) the electron diffraction pattern or the TEM image formed by the imaging lens system 22. The imaging device 26 includes a digital camera such as a charge coupled device (CCD) camera, for example. The image data of the electron diffraction pattern or the TEM image acquired by the imaging device 26 is stored in the image data storage unit 342.

The irradiation system deflector driver 28 operates the irradiation system deflector 14 on the basis of a control signal from the controller 34. The imaging system deflector driver 30 operates the imaging system deflector 24 on the basis of a control signal from the controller 34. The specimen position driver 32 operates the specimen movement mechanism 18 and the specimen tilting mechanism 20 on the basis of a control signal from the controller 34.

The controller 34 (a computer) controls the operations of the respective units of the electron microscope 100. The controller 34 performs control of adjusting the specimen tilt angle. The controller 34 includes a processing unit 340, an image data storage unit 342, a display unit 344, and a storage unit 346.

The image data storage unit 342 stores the image data of the electron diffraction pattern or the TEM image acquired by the imaging device 26.

The display unit 344 displays an image (an electron diffraction pattern, a TEM image, or the like) generated by the processing unit 340, and the function thereof can be realized by a liquid crystal display (LCD), a cathode ray tube (CRT), or the like.

The storage unit 346 stores a program, data, and the like necessary for the processing unit 340 to perform various computation processes and control processes. The storage unit 346 is used as a work area of the processing unit 340 and is also used for temporarily storing the results of calculation or the like executed by the processing unit 340 according to various programs. The functions of the image data storage unit 342 and the storage unit 346 can be realized by a memory (a storage device) such as a hard disk or a random access memory (RAM).

The processing unit 340 performs various control processes and computation processes according to a program stored in the storage unit 346. The processing unit 340 functions as an analysis unit 340a and a control unit 340b to be described later by executing a program stored in the storage unit 346. The functions of the processing unit 340 can be realized by various processors (central processing unit (CPU)) executing programs.

The analysis unit 340a reads the image data stored in the image data storage unit 342 to perform predetermined analysis, computation, and the like. The details of the processes of the analysis unit 340a will be described later.

The control unit 340b controls the respective units of the electron microscope 100. Specifically, the control unit 340b generates a control signal for controlling the respective units of the electron microscope 100 and transmits the control signal to the respective units of the electron microscope 100.

Although not illustrated in the drawings, the electron microscope 100 may include a scanning deflector and a STEM detector, and may be configured to be able to acquire scanning transmission electron microscope images (STEM images) in addition to the TEM image.

2. Specimen Tilt Angle Adjustment Method

Figure 3:
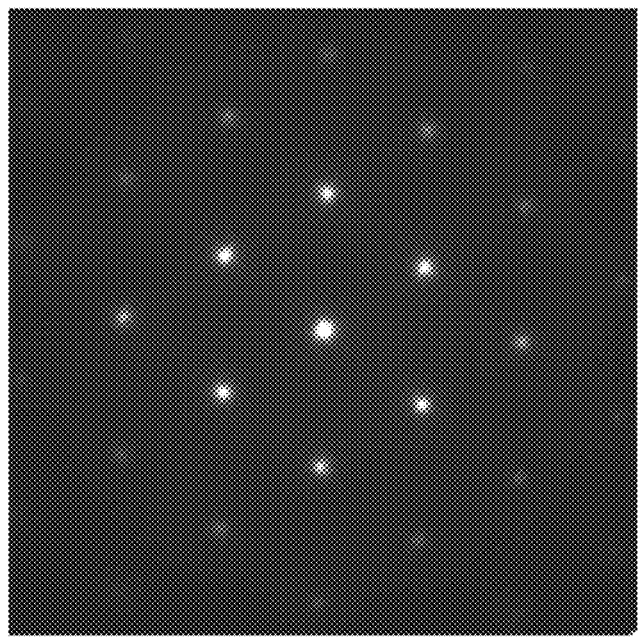
FIG. 3 is a diagram illustrating an example of an electron diffraction pattern.
Figure 4:
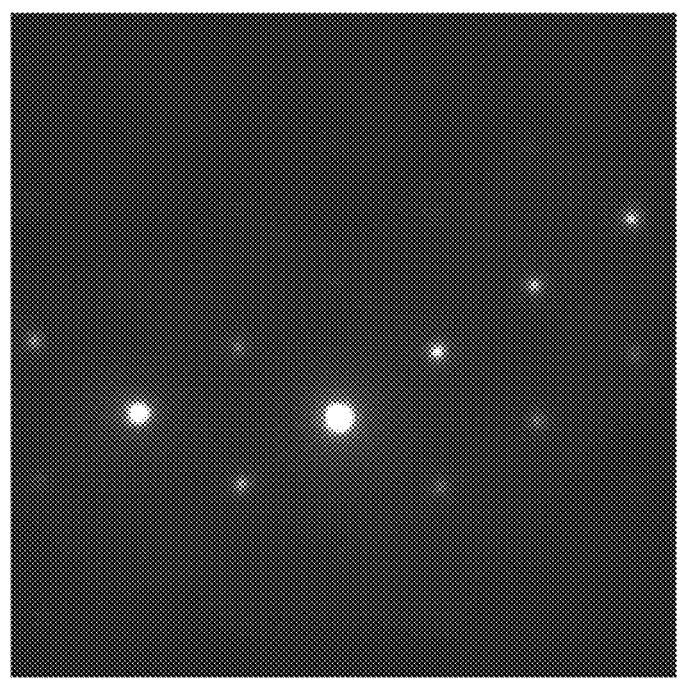
FIG. 4 is a diagram illustrating an example of an electron diffraction pattern.

Next, a specimen tilt angle adjustment method according to an embodiment of the invention will be described. FIGS. 3 and 4 illustrate examples of an electron diffraction pattern.

In an electron diffraction mode of the electron microscope 100, when a crystalline specimen is irradiated with an electron beam, such an electron diffraction pattern as illustrated in FIGS. 3 and 4 can be acquired. The electron diffraction mode is a mode in which the imaging lens system 22 forms an electron diffraction pattern formed on a back focal plane of the objective lens 22a in the imaging device 26.

The electron diffraction pattern reflects a crystal orientation of the specimen S. FIG. 3 illustrates an electron diffraction pattern in which a specimen tilt angle has been adjusted, and FIG. 4 illustrates an electron diffraction pattern in which a specimen tilt angle has not been adjusted. Generally, immediately after the specimen S is inserted in a specimen chamber of an electron microscope, such an electron diffraction pattern as illustrated in FIG. 4 is acquired. Generally, when a crystalline specimen is observed, as illustrated in FIG. 3, a specimen tilt angle is adjusted so that an incidence direction of an electron beam coincides with a crystal zone axis of the specimen. In the example illustrated in FIGS. 3 and 4, an intended crystal orientation is Si [110], the specimen tilt angle is adjusted by using the specimen tilting mechanism 20 so that such an electron diffraction pattern as illustrated in FIG. 3 is acquired, and the crystal orientation is aligned.

Hereinafter, the specimen tilt angle adjustment method according to the present embodiment will be described in detail. The specimen tilt angle adjustment method refers to adjusting the tilt angle of the specimen S so that the incidence direction of an electron beam coincides with the crystal zone axis of the specimen S. That is, adjustment of the specimen tilt angle refers to adjusting the tilt angle of the specimen S in order to align the crystal orientation of the specimen S in an electron microscope.

First, an electron beam incident on the specimen S is deflected by the irradiation system deflector 14 to thereby acquire a plurality of electron diffraction patterns obtained with electron beams having different incidence angles $\alpha$ to the specimen S.

Specifically, an electron diffraction pattern is acquired by the imaging device 26 while tilting (deflecting) an electron beam in the X-axis direction (see FIG. 2) by using the irradiation system deflector 14 and is stored in the image data storage unit 342. In this way, a plurality of electron diffraction patterns obtained with electron beams having different incidence angles $\alpha$ to the specimen S are stored in the image data storage unit 342.

Figure 5:
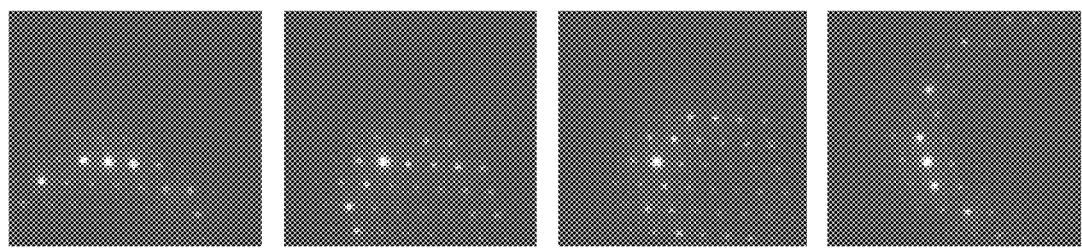
FIG. 5 illustrates a plurality of electron diffraction patterns obtained with electron beams having different incidence angles to a specimen.

FIG. 5 illustrates a plurality of electron diffraction patterns obtained with electron beams having different incidence angles $\alpha$ to the specimen S.

The plurality of electron diffraction patterns illustrated in FIG. 5 have different arrangements of electron diffraction spots since the electron diffraction patterns are obtained with electron beams having different incidence angles $\alpha$.

Here, when an electron beam incident on the specimen S is deflected by using the irradiation system deflector 14, an electron diffraction pattern may sometimes be shifted in a horizontal direction on a detection surface of the imaging device 26 according to the tilting of the electron beam. Due to this, in the electron microscope 100, the electron beam deflected by the irradiation system deflector 14 is caused to fly back by using the imaging system deflector 24 according to the amount of deflection in the irradiation system deflector 14 so that the electron beam is incident on the detection surface of the imaging device 26. In this way, it is possible to reduce a shift of the electron diffraction pattern on the detection surface of the imaging device 26 resulting from deflection of an electron beam by using the irradiation system deflector 14.

Subsequently, the plurality of acquired electron diffraction patterns are binarized. By binarizing the electron diffraction pattern, it is possible to separate an electron diffraction spot from the background. By performing binarization with respect to electron diffraction patterns, an accurate central coordinate of an electron diffraction spot to be described later is obtained even if the specimen is relative thick and it is therefore difficult to obtain a clear electron diffraction spot.

Subsequently, image processing such as labeling or calculation of center-of-gravity of brightness is performed with respect to the electron diffraction spot obtained by binarization to calculate the central coordinate (the coordinate of the center-of-gravity of brightness) of each electron diffraction spot.

Subsequently, circular approximation is performed using the central coordinate of the electron diffraction spot for respective electron diffraction patterns to calculate the center and the radius of an approximate circle. Here, circular approximation can be performed by using general mathematical methods such as the least-square method.

Figure 6:
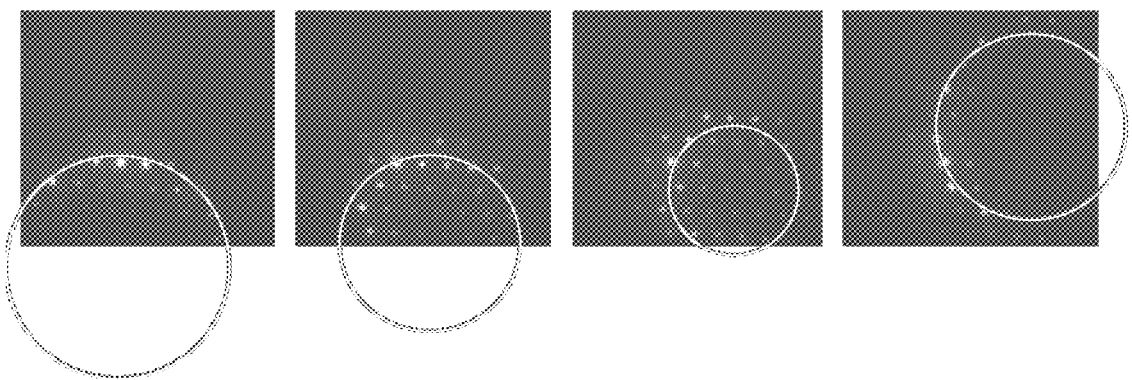
FIG. 6 is a diagram illustrating the results of circular approximation performed on each of the electron diffraction patterns.

FIG. 6 is a diagram illustrating the results of circular approximation performed on each of the electron diffraction patterns.

Figure 7:
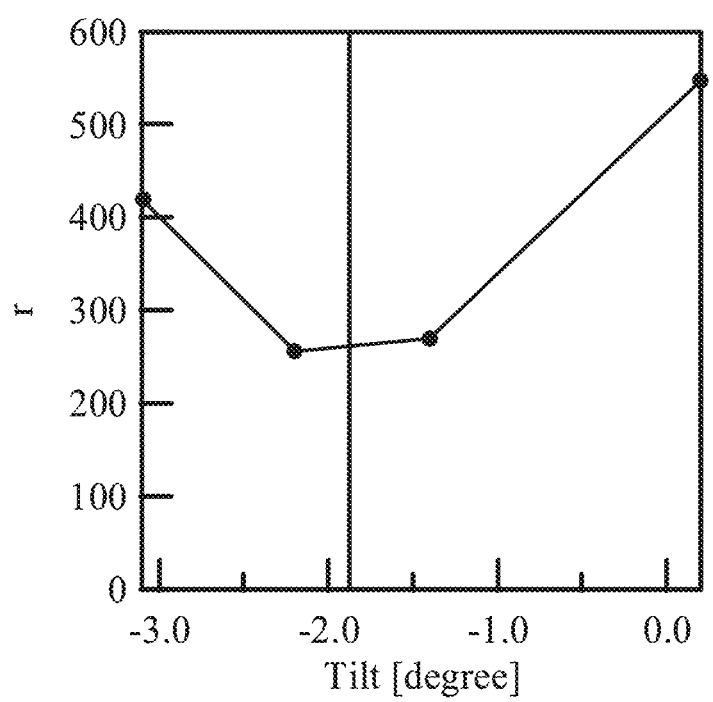
FIG. 7 is a graph plotting an incidence angle of an electron beam with respect to a radius of an approximate circle.

Subsequently, the incidence angle $\alpha$ of an electron beam when the electron diffraction pattern was acquired is plotted with respect to the radius of the obtained approximate circle. FIG. 7 is a graph plotting the incidence angle $\alpha$ of an electron beam with respect to the radius of an approximate circle. In the graph illustrated in FIG. 7, a horizontal axis indicates an incidence angle $\alpha$ and a vertical axis indicates a radius r of an approximate circle.

The radius of an approximate circle is the smallest when incidence angles $\alpha$ and $\beta$ of an electron beam are the optimal incidence angles, that is, when the specimen S has an intended crystal orientation. Therefore, the graph illustrated in FIG. 7 is fitted by using a polynomial or the like to calculate an incidence angle BT1 at which the radius of the approximate circle is the smallest. The incidence angle BT1 is an optimal incidence angle in the X-axis direction.

Subsequently, the irradiation system deflector 14 is operated so that the calculated incidence angle BT1 is obtained.

Subsequently, in a state in which the incidence angle $\alpha$ of the electron beam in the X-axis direction maintains the incidence angle BT1, an electron diffraction pattern is acquired by the imaging device 26 while tilting (deflecting) the electron beam in the Y-axis direction (see FIG. 2). In this manner, a plurality of electron diffraction patterns obtained with electron beams having different incidence angles $\beta$ to the specimen S are acquired. An incidence angle BT2 which is the optimal incidence angle $\beta$ in the Y-axis direction is calculated by using the plurality of electron diffraction patterns obtained with electron beams having different incidence angles $\beta$ according to a method similar to the above-described method of calculating the incidence angle BT1 using the plurality of electron diffraction patterns obtained with electron beams having different incidence angles $\alpha$.

Subsequently, the incidence angles $\alpha$ and $\beta$ of an electron beam are returned to the original state (the state before the adjustment was performed) by using the irradiation system deflector 14. That is, the incidence angles α and β of an electron beam are put into a state in which an electron diffraction pattern or a TEM image is acquired (a state in which an electron beam is incident on a specimen S along an optical axis OA) (for example, incidence angle α=0° and incidence angle β=0°). Moreover, when fly-back of an electron beam is performed by using the imaging system deflector 24, the imaging system deflector 24 is also returned to the original state.

Subsequently, a tilt angle of the specimen S is calculated from the incidence angle BT1 and the incidence angle BT2. Here, the incidence angle BT1 and the incidence angle BT2 are angles when the electron beam was tilted (deflected) by using the irradiation system deflector 14. The tilt angle of the specimen S is an angle when the specimen S was tilted by using the specimen tilting mechanism 20. The tilting axis of the irradiation system deflector 14 does not necessarily coincide with the tilting axis of the specimen tilting mechanism 20. That is, the x-axis direction in which the specimen tilting mechanism 20 tilts the specimen S and the X-axis direction in which the irradiation system deflector 14 tilts the electron beam do not necessarily coincide with each other. The same is applied to the relation between the y-axis direction in which the specimen tilting mechanism 20 tilts the specimen S and the Y-axis direction in which the irradiation system deflector 14 tilts an electron beam. Therefore, the tilt angle of the specimen S is expressed by the following equation.

$$STx = BT1 \cdot \cos\theta + BT1 \cdot \sin\theta \quad (1)$$

$$STy = BT2 \cdot \cos\theta + BT2 \cdot \sin\theta \quad (2)$$

Here, STx is an optimal tilt angle of the specimen S in the x-axis direction, and STy is an optimal tilt angle of the specimen S in the y-axis direction. Moreover, θ is an angle between the tilting axis of the specimen tilting mechanism 20 and the tilting axis of the irradiation system deflector 14 (that is, the angle between the X-axis and the x-axis, for example). In this way, the tilt angles STx and STy of the specimen S can be calculated.

Subsequently, the specimen S is tilted by using the specimen tilting mechanism 20 so that the specimen S has the calculated tilt angles (the tilt angles STx and STy).

With the above-described processes, the specimen tilt angle can be adjusted.

Although a case in which the incidence angle BT2 in the Y-axis direction is calculated after the incidence angle BT1 in the X-axis direction is calculated has been described, the incidence angle BT1 in the X-axis direction may be calculated after the incidence angle BT2 in the Y-axis direction is calculated.

Although the tilt angle (STx and STy) of the specimen S was calculated by using Equations (1) and (2), the tilt angle of the specimen S can be calculated by other methods.

For example, a condition equivalent to the condition of tilting the specimen S in the x-axis direction is realized by changing the incidence angles α and β simultaneously by using the irradiation system deflector 14. When a condition equivalent to a condition of tilting the specimen S in the x-axis direction from a tilt angle x to a tilt angle x' is realized by the irradiation system deflector 14, changes in the incidence angle α and the incidence angle β can be expressed by the following linear functions, respectively.

Incidence angle $\alpha = a_\alpha x + a_\alpha x$

Incidence angle $\beta = a_\beta x + b_\beta$ $a_\alpha$, $a_\alpha$, $a_\beta$, and $b_\beta$ can be calculated by performing calibration using an actual apparatus. The same is applied to the y-axis direction.

In this manner, when searching for optimal tilt angles STx and STy, by changing the incidence angles α and β simultaneously to deflect the electron beam so that the incidence direction thereof coincides with the inclination direction of the specimen S, it is not necessary to convert the incidence angle of the electron beam to the tilt angle of the specimen S unlike the above-described method.

That is, when the two tilting axes of the specimen tilting mechanism 20 do not coincide with the two tilting axes of the irradiation system deflector 14, a plurality of electron diffraction patterns are obtained by deflecting the electron beam by using the irradiation system deflector 14 so that the same electron diffraction pattern as when the specimen S was tilted about one of the tilting axes of the specimen tilting mechanism 20 is obtained and then deflecting the electron beam by using the irradiation system deflector 20 so that the same electron diffraction pattern as when the specimen S was tilted about the other tilting axis of the specimen tilting mechanism 20 is obtained. Due to this, it is not necessary to convert the incidence angle of the electron beam to the tilt angle of the specimen S by using Equations (1) and (2) above.

3. Operation of Electron Microscope

Figure 8:
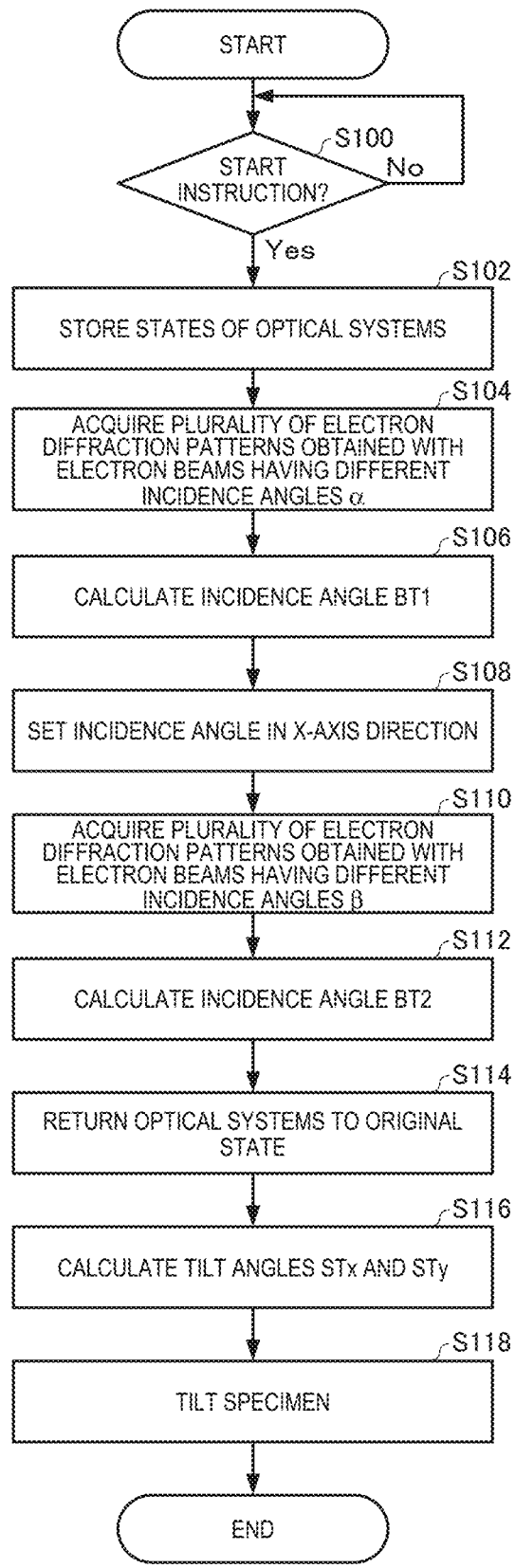
FIG. 8 is a flowchart illustrating an example of the flow of processes of a controller of an electron microscope according to an embodiment of the invention.

Next, an operation of the electron microscope 100 will be described. The electron microscope 100 can adjust the specimen tilt angle automatically. FIG. 8 is a flowchart illustrating an example of the flow of processes of the controller 34 of the electron microscope 100 according to an embodiment of the invention.

First, the processing unit 340 determines whether a user has issued an instruction (a start instruction) to start adjustment of the specimen tilt angle (S100) and waits until the start instruction is issued (S100: No). The processing unit 340 determines that the user has issued the start instruction when a start instruction is input via an operating unit (not illustrated; for example, a button, a keyboard, or a graphical user interface (GUI)).

When it is determined that the start instruction has been issued (S100: Yes), the control unit 340b stores the states (setting values) of the optical systems (the irradiation lens system 12, the irradiation system deflector 14, the imaging lens system 22, the imaging system deflector 24, and the like) of the electron microscope 100 at the present state (when it is determined that the start instruction has been issued) in the storage unit 346 (S102).

Subsequently, the control unit 340b performs control of deflecting the electron beam incident on the specimen S in the X-axis direction by using the irradiation system deflector 14 and causing the imaging device 26 to acquire a plurality of electron diffraction patterns obtained with electron beams having different incidence angles α to the specimen S (S104). In this way, the plurality of electron diffraction patterns obtained with electron beams having different incidence angles α to the specimen S are stored in the image data storage unit 342.

Subsequently, the analysis unit 340a reads the plurality of electron diffraction patterns from the image data storage unit 342 and calculates the incidence angle BT1 on the basis of the plurality of electron diffraction patterns (S106).

Specifically, the analysis unit 340a calculates an electron diffraction spot coordinate of each of the plurality of electron diffraction patterns and performs circular approximation on the electron diffraction pattern on the basis of the electron diffraction spot coordinate to calculate the radius of the approximate circle. Subsequently, the analysis unit 340*a* calculates the incidence angle BT1 at which the calculated radius of the approximate circle is minimized by fitting. The details of a method of calculating the incidence angle BT1 has been described above.

Subsequently, the control unit 340*b* controls the irradiation system deflector 14 so that the calculated incidence angle BT1 is obtained (S108). In this way, the incidence angle α in the X-axis direction of the electron beam becomes the incidence angle BT1.

Subsequently, the control unit 340*b* and the analysis unit 340*a* performs the same process as the process of calculating the incidence angle BT1 to thereby calculate the incidence angle BT2.

Specifically, first, the control unit 340*b* performs control of deflecting the electron beam incident on the specimen S in the Y-axis direction by using the irradiation system deflector 14 and causing the imaging device 26 to acquire a plurality of electron diffraction patterns obtained with electron beams having different incidence angles β to the specimen S (S110). Subsequently, the analysis unit 340*a* reads the plurality of electron diffraction patterns from the image data storage unit 342 and calculates the incidence angle BT2 on the basis of the plurality of electron diffraction patterns (S112).

Subsequently, the control unit 340*b* reads the states (setting values) of the optical systems of the electron microscope 100 stored in the storage unit 346 in the process of step S102 and returns the optical systems to the original state (the state when the start instruction was issued) (S114).

Subsequently, the analysis unit 340*a* calculates the tilt angles STx and STy from the incidence angles BT1 and BT2 (S116).

Subsequently, the control unit 340*b* controls the specimen tilting mechanism 20 so that the tilt angles of the specimen S become the calculated tilt angles STx and STy (S118). The processing unit 340 ends the process.

The order of the processes (steps) illustrated in FIG. 8 can be changed appropriately.

4. Features

The electron microscope 100 has the following features, for example.

In the electron microscope 100, the controller 34 performs a process of acquiring a plurality of electron diffraction patterns obtained with electron beams having different incidence angles to the specimen S by deflecting the electron beam incident on the specimen S by using the irradiation system deflector 14, a process of calculating the tilt angle of the specimen S on the basis of the plurality of electron diffraction patterns, and a process of controlling the specimen tilting mechanism 20 so that the calculated tilt angle is obtained.

Therefore, the electron microscope 100 can adjust the specimen tilt angle automatically. Furthermore, in the electron microscope 100, since the plurality of electron diffraction patterns are acquired by deflecting the electron beam incident on the specimen S by using the irradiation system deflector 14, it is possible to calculate the tilt angles STx and STy in a short time and to adjust the specimen tilt angle in a short time.

For example, when a plurality of electron diffraction patterns are acquired by tilting the specimen S by using the specimen tilting mechanism 20, it is necessary to operate the specimen stage 16 mechanically, which takes a considerable time. In contrast, when the electron beam is deflected by using the irradiation system deflector 14, since the irradiation system deflector 14 operates electrically, it is possible to deflect the electron beam in a short time.

In this manner, in the electron microscope 100, since the tilt angles STx and STy can be calculated in a short time, it is possible to prevent damage to the imaging device 26 or burning of the fluorescent screen (not illustrated) resulting from electron diffraction spots.

When the specimen S is tilted by using the specimen tilting mechanism 20, since a shift in a field of view due to tilting of the specimen S is large, it is difficult to align a crystal orientation with respect to a very accurate local position of the specimen S. In contrast, when the electron beam is deflected by using the irradiation system deflector 14, since a shift in a field of view due to deflection of the electron beam is small, it is possible to align a crystal orientation with respect to a very accurate local position of the specimen S.

In the electron microscope 100, it is not necessary to designate the type and the orientation of a crystalline specimen, and the specimen tilt angle is adjusted automatically when an operator presses a button (an example of an operating unit), for example. Therefore, according to the electron microscope 100, an operator can adjust the specimen tilt angle even when the operator does not have a knowledge on electron diffraction. Moreover, according to the electron microscope 100, it is not necessary to register information related to a crystal orientation of a specimen and a slim system can be realized. Furthermore, it is possible to cope with various crystalline specimens.

In the electron microscope 100, the analysis unit 340*a* calculates an electron diffraction spot coordinate of each of a plurality of acquired electron diffraction patterns, calculates the radius of an approximate circle by performing circular approximation on the electron diffraction pattern on the basis of the electron diffraction spot coordinate, calculates an incidence angle at which the calculated radius of the approximate circle is minimized by fitting, and calculates the tilt angle from the calculated incidence angle. Therefore, the electron microscope 100 can calculate the tilt angle in a short time and can adjust the specimen tilt angle in a short time.

The electron microscope 100 includes the imaging system deflector 24 that deflects an electron beam having passed through a specimen, and the controller 34 causes the electron beam deflected by the irradiation system deflector 14 to fly back by using the imaging system deflector 24 so that the electron beam is incident on the imaging device 26. Therefore, in the electron microscope 100, it is possible to reduce an image shift on the detection surface of the imaging device 26 due to deflection of the electron beam using the irradiation system deflector 14.

In the electron microscope 100, when the two tilting axes of the specimen tilting mechanism 20 and the two tilting axes of the irradiation system deflector 14 do not coincide with each other, in the process of acquiring a plurality of electron diffraction patterns, the plurality of electron diffraction patterns are acquired by deflecting the electron beam by using the irradiation system deflector 14 so that the same electron diffraction pattern as when the specimen S was tilted about one of the tilting axes of the specimen tilting mechanism 20 is acquired and then deflecting the electron beam by using the irradiation system deflector 14 so that the same electron diffraction pattern as when the specimen S was tilted about the other tilting axis of the specimen tilting mechanism 20 is acquired. Due to this, it is not necessary to convert the incidence angle of the electron beam to the tilt angle of the specimen S by using Equations (1) and (2) above.

5. Modification

The invention is not limited to the above-described embodiments and various modifications can be made within the scope of the invention.

5.1. First Modification

First, a first modification will be described. The specimen tilt angle adjustment method according to the above-described embodiments calculates an electron diffraction spot coordinate of each of a plurality of acquired electron diffraction patterns, calculates the radius of an approximate circle by performing circular approximation on the electron diffraction pattern on the basis of the electron diffraction spot coordinate, calculates an incidence angle at which the calculated radius of the approximate circle is minimized by fitting, and calculates the tilt angle from the calculated incidence angle.

In contrast, in the first modification, an electron diffraction spot coordinate is calculated for each of a plurality of acquired electron diffraction patterns, the central coordinate of an approximate circle is calculated by performing circular approximation on the electron diffraction pattern on the basis of the electron diffraction spot coordinate, the trajectory of the calculated central coordinate of the approximate circle is approximated by using a linear function, a point on a straight line of the linear function at which the distance between the straight line of the linear function and the coordinate of the direct spot is the shortest is calculated, an incidence angle at which the point is obtained is calculated, and a tilt angle is calculated from the calculated incidence angle. Hereinafter, a specimen tilt angle adjustment method according to the first modification will be described.

First, an electron beam incident on the specimen S is deflected in the X-axis direction by the irradiation system deflector 14 to thereby acquire a plurality of electron diffraction patterns obtained with electron beams having different incidence angles α to the specimen S. Subsequently, the plurality of acquired electron diffraction patterns are binarized, and image processing such as labeling or calculation of center-of-gravity of brightness is performed with respect to the electron diffraction spot obtained by binarization to calculate the central coordinate of each electron diffraction spot. Subsequently, circular approximation is performed using the central coordinate of the electron diffraction spot for respective electron diffraction patterns to calculate the center and the radius of an approximate circle. Since the processes so far are performed similarly to the above-described embodiments, the detailed description thereof will be omitted.

Figure 9:
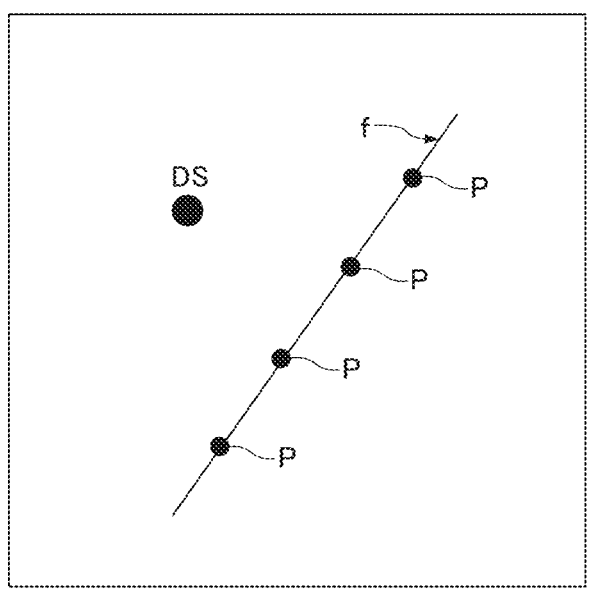
FIG. 9 is a graph plotting a central coordinate of an approximate circle and approximating to a linear function.

Here, a change in the incidence angle α of the electron beam and the trajectory of the center of the approximate circle are in a linear relation. FIG. 9 is a graph plotting a central coordinate P of the approximate circle and approximating to a linear function f.

When a central coordinate P of an approximate circle is plotted and approximated to a linear function f, the linear function f indicates the trajectory of a central coordinate of an approximate circle resulting from a change in the incidence angle α of an electron beam.

Subsequently, the coordinate (the central coordinate) of a direct spot DS is calculated. The direct spot DS is formed by imaging an electron beam having passed through the specimen S without receiving any influence from interactions with the specimen S. Although a method of determining the direct spot DS is not particularly limited, an electron diffraction spot in which the number of pixels is the largest among the electron diffraction spots in an electron diffraction pattern which has not be subjected to image processing, for example, may be used as the direct spot DS. An electron diffraction pattern used for calculating the coordinate of the direct spot DS is any one of a plurality of acquired electron diffraction patterns, for example.

Figure 10:
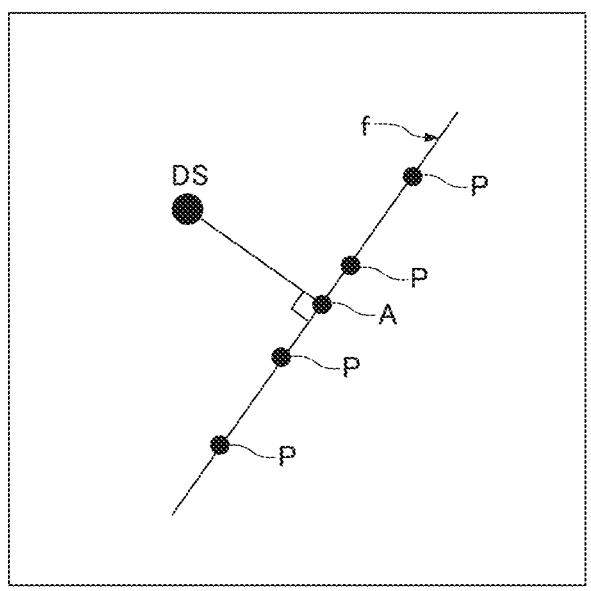
FIG. 10 is a graph illustrating a point on a linear function, at which the distance between the linear function and a direct spot is the shortest.

The optimal incidence angle BT1 of the electron beam corresponds to a point on the linear function f at which the distance between the linear function f and the direct spot DS is the shortest. Therefore, as illustrated in FIG. 10, a point A on the linear function f at which the distance between the linear function f and the direct spot DS is the shortest is calculated, and the incidence angle α corresponding to the point A is calculated. Since the respective incidence angles α of the plurality of central coordinates P on the linear function f are known, the incidence angle α corresponding to the point A can be calculated by interpolation.

With the above-described processes, it is possible to calculate the incidence angle BT1.

Figure 11:
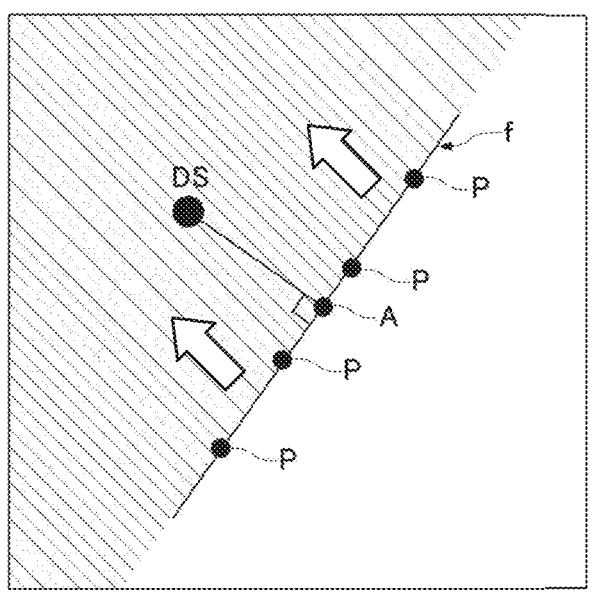
FIG. 11 is a graph for describing that a search region of an electron beam incidence angle is limited.

The incidence angle BT2 can be calculated by a method similar to the case of calculating the incidence angle BT1. Here, in the case illustrated in FIG. 10, the point corresponding to the incidence angle BT2 is in a region hatched in the graph illustrated in FIG. 11. Due to this, a direction of searching for the optimal incidence angle BT2 of the electron beam is determined with respect to the Y-axis direction (the incidence angle β). That is, when the optimal incidence angle BT2 in the Y-axis direction is calculated by using a method similar to that applied to the X-axis direction, the incidence angle β of the electron beam may be changed so that the trajectory of the center of the approximate circle changes in the direction indicated by arrow in FIG. 11 when a plurality of electron diffraction patterns are acquired. In this way, the searching region of the incidence angle of the electron beam is limited in the Y-axis direction.

The processes after the incidence angles BT1 and BT2 are calculated are similar to those of the above-described embodiments, and the description thereof will be omitted.

In the electron microscope according to the first modification, it is possible to adjust the specimen tilt angle automatically similarly to the electron microscope 100. For example, in the electron microscope according to the first modification, in the process (step S106) of calculating the incidence angle BT1 and the process (step S112) of calculating the incidence angle BT2 illustrated in FIG. 8, processes similar to those of the electron microscope 100 are performed except that the method according to the first modification is used.

According to the first modification, in the process of calculating the tilt angle, an electron diffraction spot coordinate is calculated for each of a plurality of acquired electron diffraction patterns, the central coordinate of an approximate circle is calculated by performing circular approximation on the electron diffraction pattern on the basis of the electron diffraction spot coordinate, the trajectory of the calculated central coordinate of the approximate circle is approximated by using a linear function, a point A on a straight line of the linear function at which the distance between the straight line of the linear function and the coordinate of the direct spot is the shortest is calculated, an incidence angle at which the point A is obtained is calculated, and a tilt angle is calculated from the calculated incidence angle. Therefore, according to the first modification, effects similar to those of the above-described embodiments can be obtained.

According to the first modification, since the direction in which the optimal incidence angle BT2 is present can be known when calculating the incidence angle BT1 in the X-axis direction, it is possible to limit the searching region of the incidence angle of the electron beam when calculating the incidence angle BT2 in the Y-axis direction. Therefore, it is possible to calculate the incidence angle BT2 in a shorter time with higher accuracy.

5.2. Second Modification

Next, a second modification will be described.

In the above-described embodiments, when changing the specimen tilt angle to the optimal tilt angles STx and STy, a focus shift resulting from movement of a field of view and movement of a specimen height associated with tilting of the specimen may occur. Therefore, an amorphous material portion may be irradiated with an electron beam or a different adjacent crystalline material may be irradiated with an electron beam due to tilting of the specimen.

Therefore, in the controller 34, information on a movement amount (two-dimensional information) of an observation field of view of the specimen S due to tilting of the specimen is stored in the storage unit 346 as correction data for respective specimen tilting axes. The controller 34 (the control unit 340b) reads the correction data from the storage unit 346 whenever changing the specimen tilt angle to calculate a correction value by interpolation from the correction data and controls the specimen movement mechanism 18 so as to cancel the movement amount of the observation field of view of the specimen resulting from tilting of the specimen. A correction equation may be used instead of the correction data.

Figure 12:
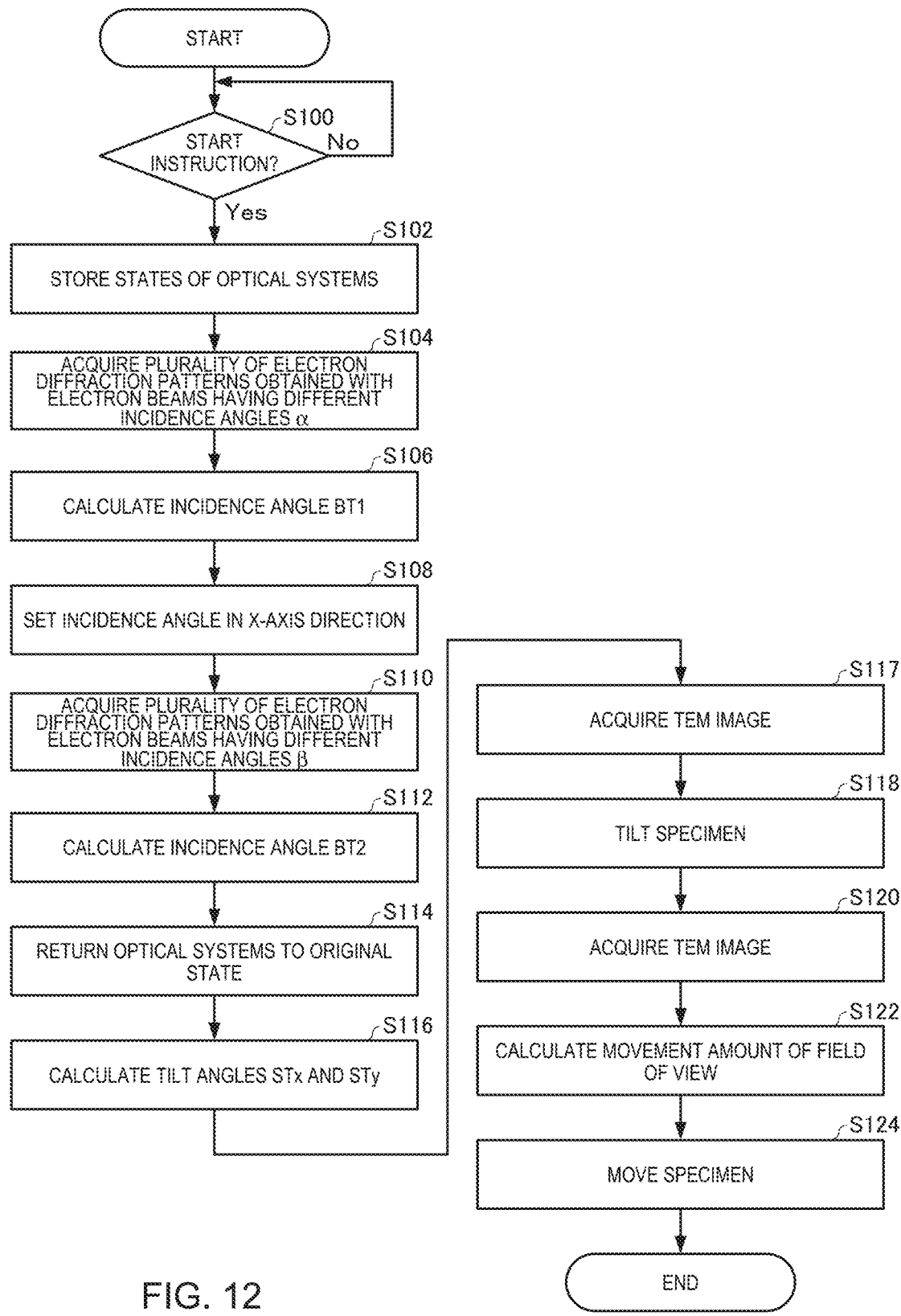
FIG. 12 is a graph illustrating an example of the flow of processes of a controller of an electron microscope according to a second modification.

Next, another method of correcting the movement of a field of view resulting from tilting of a specimen according to the second modification will be described. FIG. 12 is a flowchart illustrating an example of the flow of processes of the controller 34 of the electron microscope according to the second modification. In the flowchart illustrated in FIG. 12, steps of performing processes similar to those of the flowchart illustrated in FIG. 8 will be denoted by the same reference numerals, and the description thereof will be omitted.

The control unit 340b calculates the optimal tilt angles STx and STy (step S116), and then, acquires TEM images (or STEM images) (S117).

Subsequently, the control unit 340b controls the specimen tilting mechanism 20 and changes the tilt angle of the specimen S to the optimal tilt angles STx and STy (S118).

Subsequently, the control unit 340b performs alignment of a specimen height or focusing by the objective lens 22a to acquire TEM images (or STEM images) again (S120).

Subsequently, the controller 34 (the analysis unit 340a) calculates a field-of-view movement amount between TEM images acquired before and after the process of controlling the specimen tilting mechanism 20 (before and after tilting the specimen S) (S122). Specifically, pattern matching is performed on the TEM image acquired before the specimen S is tilted and the TEM acquired after the specimen S was tilted to calculate a movement amount (a horizontal movement amount) of the field of view of the TEM acquired after the specimen S was tilted with respect to the TEM image acquired before the specimen S is tilted.

Subsequently, the controller 34 (the control unit 340b) controls the specimen movement mechanism 18 on the basis of the calculated movement amount so that the same field of view as the field of view of the TEM image acquired before the specimen S is tilted is realized (S124). In this way, the specimen S is moved by the specimen movement mechanism 18 and the movement of the field of view resulting from tilting of the specimen can be corrected.

In the second modification, the controller 34 performs a process of acquiring the TEM image before the process of controlling the specimen tilting mechanism 20 is performed, a process of acquiring the TEM image after the process of controlling the specimen tilting mechanism 20 is performed, a process of calculating a field-of-view movement amount between the TEM images acquired before and after the process of controlling the specimen tilting mechanism 20 is performed, and a process of controlling the specimen movement mechanism 18 on the basis of the calculated field-of-view movement amount so that the same field of view as the field of view of the TEM image acquired before the process of controlling the specimen tilting mechanism 20 is performed is realized. Therefore, it is possible to reduce a shift in the field of view resulting from tilting of the specimen.

The above-described embodiments and modifications are examples and are not limited thereto. For example, the embodiments and the modifications can be combined appropriately.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. An electron microscope comprising:
    an irradiation lens system that irradiates a specimen with an electron beam;
    an irradiation system deflector that deflects an electron beam incident on the specimen;
    a specimen tilting mechanism that tilts the specimen;
    an imaging lens system that forms an electron diffraction pattern or an electron microscope image by using an electron having passed through the specimen;
    an imaging device that acquires the electron diffraction pattern or the electron microscope image formed by the imaging lens system; and
    a controller that controls the irradiation system deflector and the specimen tilting mechanism,
    the controller configured to:
    acquire a plurality of electron diffraction patterns formed by using electron beams having different incidence angles BT1 and BT2 to the specimen, the different incidence angles BT1 and BT2 having been obtained by deflecting the electron beams incident on the specimen by using the irradiation system deflector;
    calculate a tilt angle of the specimen based on the plurality of electron diffraction patterns; and
    control the specimen tilting mechanism so that the specimen has the calculated tilt angle, wherein:

the calculated tilt angle comprises the combination of tilt angles of the specimen in a first direction STx and a second direction STy that is perpendicular to STx;

$STx = BT1 \cos \theta + BT1 \sin \theta;$ $STy = BT2 \cos \theta + BT2 \sin \theta;$ and $\theta$ = an angle between a tilting axis of the specimen tilting mechanism and a tilting axis of the irradiation system deflector wherein:
the controller calculates the tilt angle by;
calculating an electron diffraction spot coordinate for each of the plurality of acquired electron diffraction patterns, and performing circular approximation on each of the electron diffraction patterns based on the electron diffraction spot coordinate to calculate a radius of an approximate circle;
calculating the incidence angle at which the calculated radius of the approximate circle is minimized by fitting; and
calculating the tilt angle from the calculated incidence angle;

and wherein:
the specimen tilting mechanism has two tilting axes;
the irradiation system deflector has two tilting axes; and
the two tilting axes of the specimen tilting mechanism and the two tilting axes of the irradiation system deflector do not coincide with each other.

2. The electron microscope according to claim 1, wherein the controller calculates the tilt angle by:
calculating an electron diffraction spot coordinate for each of the plurality of acquired electron diffraction patterns, and performing circular approximation on each of the electron diffraction patterns based on the electron diffraction spot coordinate to calculate a central coordinate of an approximate circle;
approximating a trajectory of the calculated central coordinate of the approximate circle by using a linear function; and
calculating a point on a straight line of the linear function at which a distance between the straight line of the linear function and a coordinate of a direct spot is the shortest, calculating the incidence angle at which the point is obtained, and calculating the tilt angle from the calculated incidence angle.

3. The electron microscope according to claim 1 further comprising a specimen movement mechanism that moves the specimen, wherein
the controller is further configured to:
acquire an electron microscope image before controlling the specimen tilting mechanism;
acquire an electron microscope image after controlling the specimen tilting mechanism;
calculate a field-of-view movement amount between the electron microscope images acquired before and after controlling the specimen tilting mechanism; and
control the specimen movement mechanism based on the field-of-view movement amount so that the electron microscope obtains the same field of view as the field of view of the electron microscope image acquired before controlling the specimen tilting mechanism.

4. The electron microscope according to claim 1, further comprising: an imaging system deflector that deflects an electron beam having passed through the specimen, wherein the controller causes the electron beam deflected by the irradiation system deflector to fly back by using the imaging system deflector so that the electron beam is incident on the imaging device.

5. An electron microscope comprising:
an irradiation lens system that irradiates a specimen with an electron beam;
an irradiation system deflector that deflects an electron beam incident on the specimen;
a specimen tilting mechanism that tilts the specimen;
an imaging lens system that forms an electron diffraction pattern or an electron microscope image by using an electron having passed through the specimen;
an imaging device that acquires the electron diffraction pattern or the electron microscope image formed by the imaging lens system; and
a controller that controls the irradiation system deflector and the specimen tilting mechanism,
the controller configured to:
acquire a plurality of electron diffraction patterns formed by using electron beams having different incidence angles to the specimen, the different incidence angles having been obtained by deflecting the electron beams incident on the specimen by using the irradiation system deflector;
calculate a tilt angle of the specimen based on the plurality of electron diffraction patterns; and
control the specimen tilting mechanism so that the specimen has the calculated tilt angle, wherein
the specimen tilting mechanism has two tilting axes,
the irradiation system deflector has two tilting axes,
the two tilting axes of the specimen tilting mechanism and the two tilting axes of the irradiation system deflector do not coincide with each other, and
when the controller acquires the plurality of electron diffraction patterns, the plurality of electron diffraction patterns are acquired by:
deflecting an electron beam by using the irradiation system deflector so that the same electron diffraction pattern as that when the specimen was tilted about one of the tilting axes of the specimen tilting mechanism is obtained; and
deflecting an electron beam by using the irradiation system deflector so that the same electron diffraction pattern as that when the specimen was tilted about the other tilting axis of the specimen tilting mechanism is obtained.

6. A specimen tilt angle adjustment method in an electron microscope including an irradiation lens system that irradiates a specimen with an electron beam, an irradiation system deflector that deflects an electron beam incident on the specimen, a specimen tilting mechanism that tilts the specimen, an imaging lens system that forms an electron diffraction pattern or an electron microscope image by using an electron having passed through the specimen, and an imaging device that acquires the electron diffraction pattern or the electron microscope image formed by the imaging lens system,
the method comprising:
acquiring a plurality of electron diffraction patterns formed by using electron beams having different incidence angles BT1 and BT2 to the specimen, the different incidence angles BT1 and BT2 having been obtained by deflecting the electron beams incident on the specimen by using the irradiation system deflector;
calculating a tilt angle of the specimen based on the plurality of electron diffraction patterns; and
tilting the specimen to have the calculated tilt angle, wherein:

the calculated tilt angle comprises the combination of tilt angles of the specimen in a first direction STx and a second direction STy that is perpendicular to STx;

$STx = BT1 \cos\theta + BT1 \sin\theta;$ $STy = BT2 \cos\theta + BT2 \sin\theta;$ and θ=an angle between a tilting axis of the specimen tilting mechanism and a tilting axis of the irradiation system deflector wherein:
the controller calculates the tilt angle by;
calculating an electron diffraction spot coordinate for each of the plurality of acquired electron diffraction patterns, and performing circular approximation on each of the electron diffraction patterns based on the electron diffraction spot coordinate to calculate a radius of an approximate circle;
calculating the incidence angle at which the calculated radius of the approximate circle is minimized by fitting; and
calculating the tilt angle from the calculated incidence angle;

and wherein:
the specimen tilting mechanism has two tilting axes;
the irradiation system deflector has two tilting axes; and
the two tilting axes of the specimen tilting mechanism and the two tilting axes of the irradiation system deflector do not coincide with each other.

* * * * *